(12) United States Patent
Rahman et al.

(10) Patent No.: US 8,384,225 B2
(45) Date of Patent: Feb. 26, 2013

(54) THROUGH SILICON VIA WITH IMPROVED RELIABILITY

(75) Inventors: Arifur Rahman, San Jose, CA (US); Bahareh Banijamali, Los Altos, CA (US)

(73) Assignee: Xilinx, Inc., San Jose, CA (US)

( * ) Notice: Subject to any disclaimer, the term of this patent is extended or adjusted under 35 U.S.C. 154(b) by 201 days.

(21) Appl. No.: 12/945,700

(22) Filed: Nov. 12, 2010

(65) Prior Publication Data

US 2012/0119374 A1    May 17, 2012

(51) Int. Cl.
*H01L 23/48* (2006.01)
(52) U.S. Cl. ........ 257/774; 257/621; 257/698; 257/738; 438/104; 438/108; 438/612; 438/692; 438/748
(58) Field of Classification Search .................. None
See application file for complete search history.

(56) References Cited

U.S. PATENT DOCUMENTS

| | | | | |
|---|---|---|---|---|
| 5,277,755 | A | * | 1/1994 | O'Neill .......................... 216/2 |
| 7,081,408 | B2 | * | 7/2006 | Lane et al. .................... 438/637 |
| 2008/0237881 | A1 | * | 10/2008 | Dambrauskas et al. ...... 257/774 |
| 2010/0171218 | A1 | * | 7/2010 | Aoi ............................... 257/741 |
| 2010/0327422 | A1 | | 12/2010 | Lee et al. |

FOREIGN PATENT DOCUMENTS

| | | |
|---|---|---|
| JP | 2008091628 | 4/2008 |
| WO | WO 2005/086237 A2 | 9/2005 |
| WO | WO 2009/137313 A1 | 11/2009 |

OTHER PUBLICATIONS

Eaton, B. et al., "Deep silicon etch for TSVs with Improved Via Profile/Process Control", Solid State Technology, ElectroIQ, The Portal for Electronics Manufacturing, Oct. 27, 2010, pp. 1-4.
Lassig, S., "3-D Integration with Through Silicon Vias: An Etch Perspective", Lam Research Corporation, Test, Assembly and Packaging TechXPOT, Semicon West, Jul. 16, 2008, pp. 1-21.
Motoyoshi, M., "Through-Silicon via (TSV)", Proceeding of the IEEE, vol. 97, No. 1, Tokyo Institute of Technology Yokohama, Jan. 2009, pp. 43-48.
Puech, M. et al., "Fabrication of 3D packaging TSV using DRIE", ALCATEL Mirco Machining Systems, created Sep. 21, 2007, 1 pg.
Puech, M., et al., "DRIE for Through Silicon Via EMC 3D", ALCATEL Mirco Machining Systems, pp. 1-27, created Jul. 30, 2007, www.emc3d.org.

* cited by examiner

*Primary Examiner* — Kyoung Lee
(74) *Attorney, Agent, or Firm* — Gerald Chan

(57) ABSTRACT

A semiconductor device includes a substrate having a top surface and a bottom surface, and a through-silicon via (TSV) extending from the top surface of the substrate to the bottom surface of the substrate, the TSV having a height and a side profile extending along a longitudinal axis, wherein the side profile has an upper segment forming a first angle relative to the longitudinal axis, and a lower segment forming a second angle relative to the longitudinal axis, the second angle being different from the first angle, and wherein the lower segment has a height that is less than 20% of the height of the TSV.

18 Claims, 4 Drawing Sheets

THROUGH SILICON VIA WITH IMPROVED RELIABILITY

TECHNICAL FIELD

An embodiment described herein relates to semiconductor devices, and in particular, to through-silicon vias for interconnecting silicon devices and a method of forming thereof.

BACKGROUND

To increase circuit density and to integrate multiple devices into a single package, two or more integrated circuits (ICs) on different dies may be stacked vertically or horizontally in a package. In such stacked-die devices, through-silicon vias (TSVs) may be used to interconnect multiple devices and to connect the devices to pads on a package. Unlike traditional wire bonding technologies which are limited to connections made around the periphery of a device, TSVs allows vertical connections between devices through the body of silicon die. This may provide shorter physical connections between devices and enable higher density and higher aspect ratio connections. It would be desirable to provide TSVs having a reduced cross sectional dimension at certain location(s).

SUMMARY

In accordance with an embodiment, a semiconductor device includes a substrate having a top surface and a bottom surface, and a through-silicon via (TSV) extending from the top surface of the substrate to the bottom surface of the substrate, the TSV having a height and a side profile extending along a longitudinal axis, wherein the side profile has an upper segment forming a first angle relative to the longitudinal axis, and a lower segment forming a second angle relative to the longitudinal axis, the second angle being different from the first angle, and wherein the lower segment has a height that is less than 20% of the height of the TSV.

In accordance with another embodiment, a semiconductor device includes a substrate having a top surface and a bottom surface, and a through-silicon via (TSV) extending from the top surface of the substrate to the bottom surface of the substrate, the TSV having a top portion, a middle portion, and a bottom portion, wherein the top portion of the TSV has a cross sectional dimension that is smaller than a cross sectional dimension of the middle portion of the TSV, and wherein the bottom portion of the TSV has a cross sectional dimension that is smaller than the cross sectional dimension of the middle portion of the TSV.

In accordance with yet another embodiment, a method of forming a through-silicon via (TSV) having a height and a side profile extending along a longitudinal axis includes providing a substrate, anisotropically etching the substrate to form an upper segment of the side profile, and isotropically etching the substrate to form a lower segment of the side profile, wherein the upper segment forms a first angle relative to the longitudinal axis, the lower segment forms a second angle relative to the longitudinal axis, and the second angle is different from the first angle, and wherein the lower segment has a height that is less than 20% of the height of the TSV.

Other and further aspects and features will be evident from reading the following detailed description of the embodiments.

BRIEF DESCRIPTION OF THE DRAWINGS

The drawings illustrate the design and utility of embodiments, in which similar elements are referred to by common reference numerals. These drawings are not necessarily drawn to scale. In order to better appreciate how the above-recited and other advantages and objects are obtained, a more particular description of the embodiments will be rendered, which are illustrated in the accompanying drawings. These drawings depict only typical embodiments and are not therefore to be considered limiting of its scope.

DETAILED DESCRIPTION

Figure 1:
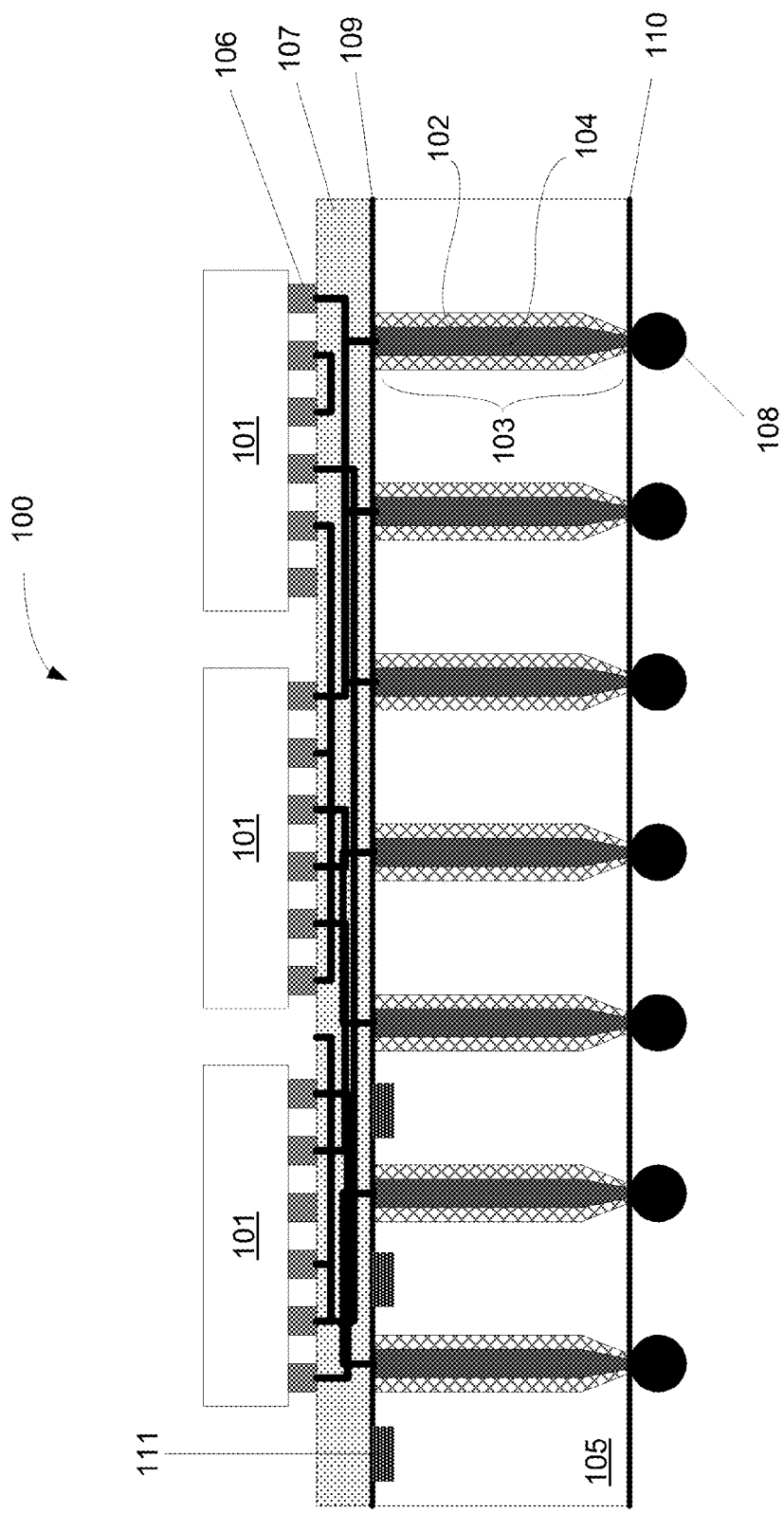
FIG. 1 illustrates a stacked-die semiconductor device with through-silicon vias (TSVs).

Various embodiments are described hereinafter with reference to the figures. It should be noted that the figures are not drawn to scale and that elements of similar structures or functions are represented by like reference numerals throughout the figures. It should also be noted that the figures are only intended to facilitate the description of the embodiments. They are not intended as an exhaustive description of the invention or as a limitation on the scope of the invention. In addition, an illustrated embodiment needs not have all the aspects or advantages shown. An aspect or an advantage described in conjunction with a particular embodiment is not necessarily limited to that embodiment and can be practiced in any other embodiments even if not so illustrated.

Also, reference throughout this specification to "some embodiments" or "other embodiments" means that a particular feature, structure, material, or characteristic described in connection with the embodiments is included in at least one embodiment of the invention. Thus, the appearances of the phrase "in some embodiments" or "in other embodiments" in various places throughout this specification are not necessarily referring to the same embodiment or embodiments.

FIG. 1 illustrates a stacked-die semiconductor device 100 with through-silicon vias (TSVs) 103 in accordance with some embodiments. The device 100 includes a plurality of integrated circuits (ICs) 101, a plurality of micro-bumps 106, a local interconnect layer 107, and a substrate 105. The substrate 105 has a top surface 109 and a bottom surface 110, with the TSVs 103 extending therebetween. The substrate 105 may be an interposer layer made of silicon or other semiconductor material. Furthermore, the interposer layer may be a passive layer with no active components. In other embodiments, the interposer layer may be an active layer that includes one or more active elements 111. By means of non-limiting example, the elements 111 may be transistors, such as field-effect transistors (FETs). In other embodiments, the device 100 does not include the FETs 111. As shown in the figure, the ICs 101 are coupled to the tight-pitched microbumps 106 for high-density interconnect on the local interconnect layer 107 above the top surface 109 of the substrate 105. Coarse-pitched TSVs 103 are formed through the substrate 105 to connect the local interconnect layer 107 down to pads 108 on the bottom surface 110 of the substrate 105. In the illustrated embodiments, the pads 108 may be controlled collapse chip connection (C4) bumps. In other embodiments, the pads 108 may be other types of solder bumps, or other types of terminals. Thus, as used in this specification, the term "pad" should not be limited to any terminal that has a planar configuration, and may refer to terminal that has any configuration.

The ICs 101 are illustrated as being stacked horizontally. In other embodiments, the ICs 101 may be stacked vertically in the package. Each of the ICs 101 may include a field programmable logic array (FPGA), random access memory (RAM), a processor (e.g., a digital signal processing unit (DSP), a central processing unit (CPU)), or any of other types of circuits. Although three ICs 101 are shown in the figure, in other embodiments, the device 100 may include less than three ICs (e.g., one IC), or may include more than three ICs. In some embodiments, two or more of the ICs 101 may be respective FPGAs. In other embodiments, the device 100 may include a combination of different circuits 101. For example, in other embodiments, the device 100 may include one or more FPGAs and one or more processors.

As shown in the figure, each of the TSVs 103 includes a core 104 surrounded by a layer (or liner) 102. In the illustrated embodiments, the core 104 includes copper (Cu). In other embodiments, the core 104 may include tungsten (W), or other types of conductive material. Also, in the illustrated embodiments, the layer 102 is made of an oxide such as silicon dioxide, but may be made from other insulating materials in other embodiments. In further embodiments, the TSVs 103 may include additional layer(s) surrounding the layer 102. Each TSV 103 may have a circular cross section, or a non-circular cross section (such as a rectangular cross section, an elliptical cross section, etc.).

Due to mismatches in the coefficient of thermal expansions (CTE) between the TSV 103 and its surrounding materials such as the oxide liner 102 and the silicon substrate 105, the bottom part of the TSV 103 which interfaces with pads 108 (such as the C4 bumps) encounters the highest thermo-mechanical stress. The stress may be created during a manufacturing process, and/or during operation of the device 100, in which parts of the device may be subjected to heating. Stress induced by the TSV 103 on its surroundings depends quadratically on the dimension of the horizontal cross section of the TSV 103. An embodiment of the TSV 103 described herein has a reduced cross sectional dimension in region(s) where the stress is significant, such as at the interface between the pads 108 and the TSV 103. This has the effect of reducing the overall stress induced by the TSV 103, thereby reducing the risk of cracking of silicon, delamination of the TSVs 103, and acceleration of electromigration (EM) failure.

Figure 2A:
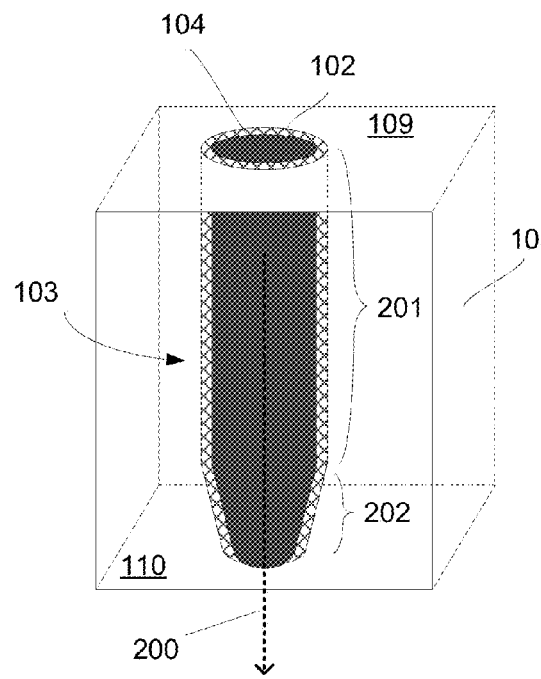
FIG. 2A and FIG. 2B illustrates an example of the side profile of a TSV structure with a vertical or near vertical upper sidewall segment and a tapered second sidewall segment in accordance with some embodiments.
Figure 2B:
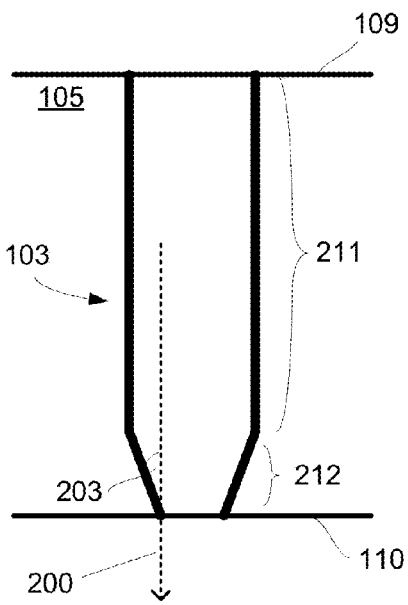

FIG. 2A and FIG. 2B shows an exemplary structure of the TSV 103 in accordance with some embodiments. In the illustrated example, the TSV 103 has a circular horizontal cross section. The TSV 103 has an upper portion 201 extending down from the top surface 109 of the substrate 105 along a vertical longitudinal axis 200 and a lower portion 202 extending from this upper portion 201 down to the bottom surface 110 of the substrate 105. As used in this specification, the term "longitudinal axis" refers to any axis that extends longitudinally through the cross section of the TSV, and may or may not go through a center of the TSV. The upper portion 201 of the TSV 103 forms an elongated shape having a circular cross section, and the lower portion 202 forms a conical frustum shape. Although the surfaces of the sidewalls (or side portions) of the TSV 103 appear smooth in the drawings for illustrative purposes, the actual surface of the sidewalls may be rough and scalloped with micro-imperfections. Thus, it should be understood that the shape or profile of the TSV 103 described herein in different embodiments refers to the overall profile of the TSV 103 structure (or portion thereof), ignoring any micro-imperfections that may exist.

In the illustrated embodiments, the height of the lower portion 202 of the TSV 103 may be less than 20% (such as 10%, 5%, 1%, or less) of the total height of the TSV 103. Such configuration allows a majority of the length of the TSV 103 to have a prescribed minimum cross sectional dimension, while narrowing the cross sectional dimension of the TSV 103 only near the surface 110 where the induced stress may be the highest. Requiring the TSV 103 to have a certain prescribed minimum dimension along the majority of the length of the TSV 103 (except where the area reduction is desired) is advantageous because the resulting TSV 103 would not be thin along the majority of the length of the TSV 103. This may allow the TSV 103 to effectively and reliably transmit signals, and the TSV 103 will be less likely to fail (because the structural integrity of the TSV 103 is maintained). In other embodiments, the height of the lower portion 202 of the TSV 103 may be more than 20% of the total height of the TSV 103. Also, in the illustrated embodiments, the dimension of the smallest cross section of the TSV 103 (e.g., the cross section at surface 110) is less than 95% (such as 85% or less) of the cross sectional dimension of the TSV 103 at the upper surface 109. Such configuration allows the stress at the bottom of the TSV 103 to be reduced effectively. Also, in any of the embodiments described herein the dimension of the smallest cross section of the TSV 103 may be at least 10%, and more preferably, at least 30% (such as 50%) of the largest cross sectional dimension of the TSV 103. This will prevent the connection area between the TSV 103 and the pad 108 from being too small, which may increase the risk of connection breakage between the TSV 103 and the pad 108. In one implementation, the smallest dimension of the TSV 103 may have a value that is anywhere between 30% and 95%, and more preferably, between 50% and 85% (e.g., 80%), of the largest cross sectional dimension along the length of the TSV 30.

FIG. 2B illustrates a side profile of the TSV 103 of FIG. 2A. As used in this specification, the term "side profile" refers to a profile of the TSV that extends at least a distance between the top and bottom surfaces of the substrate, and may or may not refer to a side profile that forms a 90 degree angle with the top/bottom surface of the substrate. The side profile has a first segment 211 along the side of the upper portion 201 that extends from the top surface 109 of the substrate, and is vertical forming an angle of about 0 degrees (e.g., 0±10 degrees) with the longitudinal axis 200. A second segment 212 along the side of the lower portion 202 extends from the bottom of the first segment 201 down to the bottom surface 110 of the substrate 105. In the illustrated example, the second segment 212 forms an angle 203 of 30 degrees with the longitudinal axis 200. In other embodiments, this angle 203 may be any angle as long as it is greater than the angle between the first segment 211 and the longitudinal axis 200. The resulting structure of the TSV 103 has a tapered bottom portion such that a horizontal cross section at the bottom of the TSV 103 is smaller than a horizontal cross section at other portions of the TSV 103. By selectively reducing the dimension of the horizontal cross section at the bottom of the TSV 103, the stress induced by the TSV 103 against the pads 108 (such as C4, other solder bumps, or other terminals) at the bottom of the TSV 103 may be reduced.

Figure 3:
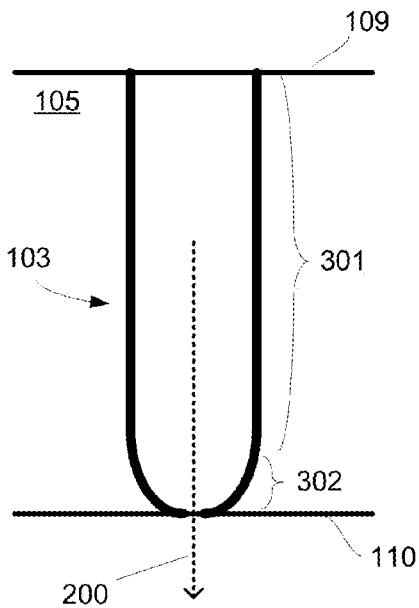
FIG. 3 illustrates another example of the side profile of a TSV structure with a vertical or near vertical upper sidewall segment, but with a curvilinear second sidewall segment.

FIG. 3 illustrates a side profile of the TSV 103 in accordance with other embodiments. The side profile has a first segment 301 that extends from the top surface 109 of the substrate 105 and is vertical forming an angle of about 0 degrees (e.g., 0±10 degrees) with the longitudinal axis 200. A second segment 302 extends from the bottom of the first segment 301 down to the bottom surface 110 of the substrate 105 in a curvilinear configuration. An angle formed between the second segment 302 and the longitudinal axis 200 varies along the curvature of the second segment 302. The resulting structure of the TSV 103 may have a dome-like frustum shaped bottom portion. In other embodiments, the curvature of the second segment 302 may be concave or convex. The resulting horizontal cross section at the bottom of the TSV 103 is smaller than a horizontal cross section of other portions of the TSV 103.

Figure 4:
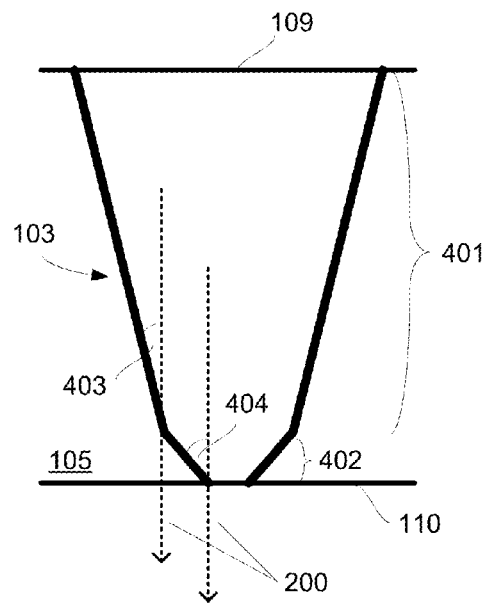
FIG. 4 illustrates an example of the side profile of a TSV structure with a tapered upper sidewall segment and a tapered second sidewall segment in accordance with some embodiments.

In other embodiments, the TSV 103 may have a side profile as shown in FIG. 4. The side profile has a first segment 401 that extends from the top surface 109 of the substrate 105 in a tapered configuration. In the illustrated example, the first segment 401 forms an angle 403 of 20 degrees with the longitudinal axis 200. In other embodiments, the first segment 401 may form other angles 403 greater than 0 degrees with the longitudinal axis 200. A second segment 402 extends from the bottom of the first segment 401 down to the bottom surface 110 of the substrate 105. The angle 404 formed by the second segment 402 with the longitudinal axis 200 is greater than the angle 403 formed by the first segment 401. Hence, the bottom portion of the TSV 103 is more tapered than the upper portion of the TSV 103.

Figure 5:
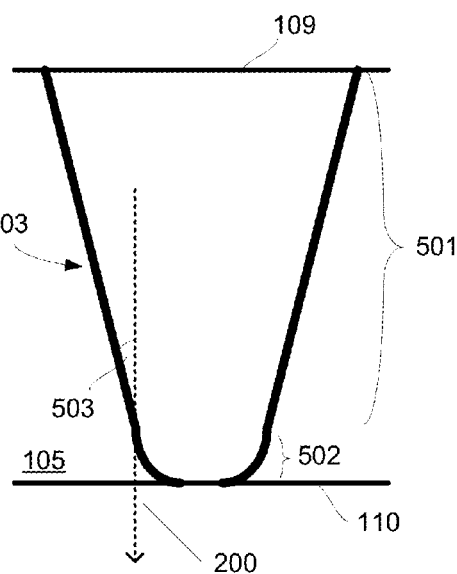
FIG. 5 illustrates another example of the side profile of a TSV structure with a tapered upper sidewall segment, but with a tapered second sidewall segment in accordance with some embodiments.

FIG. 5 illustrates a side profile of the TSV 103 in accordance with other embodiments. As in FIG. 4, the side profile has a first segment 501 that extends from the top surface 109 of the substrate 105 in a tapered configuration. In the illustrated example, the first segment 501 forms an angle 503 of 20 degrees with the longitudinal axis 200. In other embodiments, the first segment may form other angles 503 greater than 0 degrees with the longitudinal axis 200. A second segment 502 extends from the bottom of the first segment 501 down to the bottom surface 110 of the substrate 105 in a curvilinear configuration. An angle formed between the second segment 502 and the longitudinal axis 200 varies along the curvature of the second segment 502. The resulting structure of the TSV 103 may have a dome-like frustum shaped bottom portion. In other embodiments, the curvature of the second segment 502 may be concave or convex. The resulting horizontal cross section at the bottom of the TSV 103 is smaller than a horizontal cross section at other portions of the TSV 103.

Figure 6:
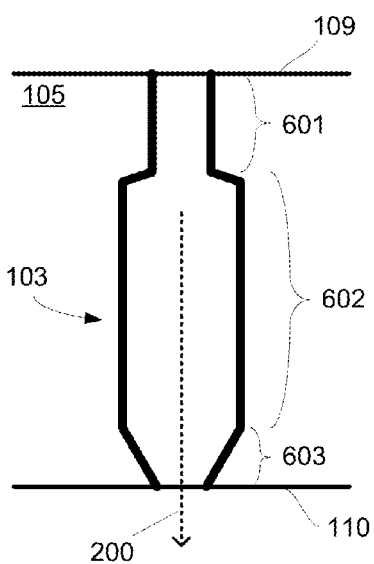
FIG. 6 illustrates an example of the side profile of a TSV structure with three segments in accordance with some embodiments.

In yet other embodiments, a side profile of the TSV 103 may have three segments as shown in FIG. 6. An upper segment 601 of the TSV 103 extends along a longitudinal axis 200 from the top surface 109 of the substrate 105 down to a middle segment 602. The middle segment 602 extends from the upper segment 601 down to a lower segment 603, and the lower segment 603 extends from the middle segment 602 down to the bottom surface 110 of the substrate 105. In this example, the horizontal cross sections of the upper segment 601 and lower segment 603 are both smaller than a horizontal cross section of the middle segment 602. The middle segment 602 may be vertical to form an angle of about 0 degrees (e.g., 0±10 degrees) with the longitudinal axis 200. Additionally, the horizontal cross section area of the upper segment 601 may decrease as a function of distance away from the middle segment 602. In other embodiments, the horizontal cross section area of the upper segment 601 may increase as a function of distance away from the middle segment 602. The lower segment 603 may form an angle greater than 0 degrees with the longitudinal axis 200 in a tapered configuration in some embodiments. The resulting horizontal cross section of the lower segment 603 has an area that decreases as a function of distance away from the middle segment 602. The configuration of the TSV 103 shown in the illustrated embodiments is advantageous because it may reduce thermally induced stress at electrical connections at the bottom surface 110, at the top surface 109, or both surfaces 109, 110, of the substrate 105. In other embodiments, the lower segment 603 may have a curvilinear configuration like that shown in FIG. 3. In further embodiments, the upper segment 601 may have a tapered configuration like that of the lower segment 603, or a curvilinear configuration like that shown in FIG. 3.

In the above embodiments, the TSV 103 has been described as having a circular cross section throughout its length. In other embodiments, the TSV 103 may have a non-circular cross section. For example, in other embodiments, the cross section of the TSV 103 may have a rectangular shape or some other shape, while maintaining a side profile as shown in the exemplary figures. In such cases, the horizontal cross section of the TSV 103 at the bottom surface 110 of the substrate 105 is smaller than the horizontal cross section at other portion of the TSV 103. By selectively reducing the horizontal cross section area at the bottom of the TSV 103, or at other areas that may be potentially subject to significant stress, the induced stress induced at the bottom of the TSV 103 or at other locations may be reduced.

Figure 7:
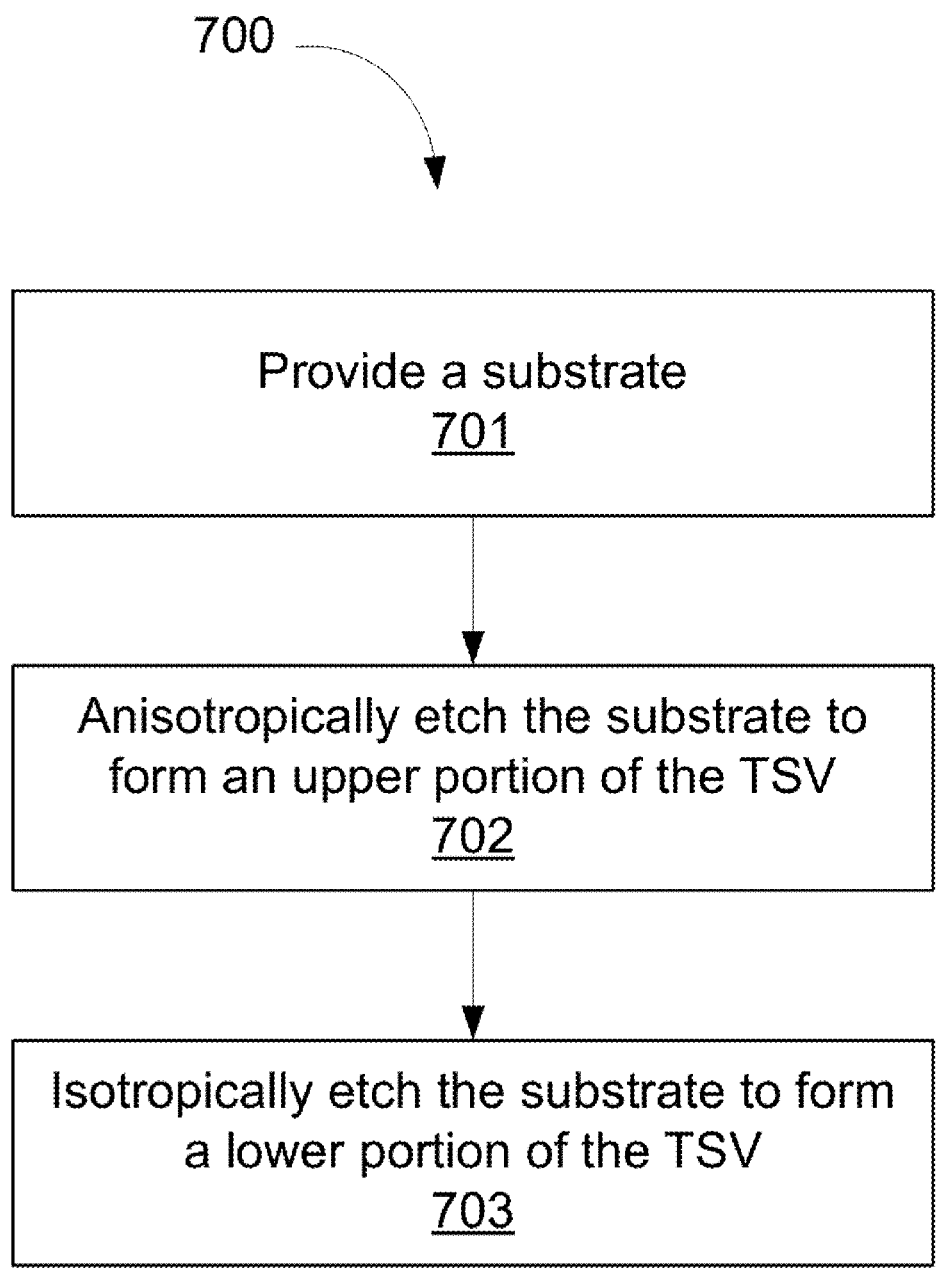
FIG. 7 illustrates a method of forming a TSV structure in accordance with some embodiments.

To create the TSV 103 side profiles in accordance the embodiments described herein, the method 700 of FIG. 7 may be used in accordance with some embodiments. A substrate (such as the substrate 105) is first provided in step 701. In step 702, an anisotropic etch process may be applied to the substrate to form an upper portion of the TSV. The anisotropic etch process may be a Bosch process and may include a series of small isotropic etching steps. The Bosch process provides high etch rates and allows for via shapes with high aspect ratios such as the upper portion of the TSV in accordance to some embodiments.

In step 703, an isotropic etch process may be applied to the substrate. The isotropic etch process may be a steady-state process or other deep reactive-ion etching (DRIE) processes. The steady-state process and other DRIE processes provide easy profile control to form tapered and curvilinear TSV shapes (such as the embodiments of the bottom portion of the TSV 103 described herein). By combining anisotropic etch processes with isotropic etch processes, complex TSV shapes may be formed in accordance with some embodiments to selectively reduce the horizontal cross section at different portions of the TSV 103.

In some cases, the bottom of the TSV 103 where the TSV 103 interfaces with the pads 108 may have the highest stress (e.g., due to packaging of the device). The stress induced by the TSV 103 depends quadratically on the dimension of the horizontal cross section of the TSV 103 at this interface between the pads 108 and the TSV 103. Therefore, a reduction in the horizontal cross section of the TSV 103 at this interface reduces the overall stress induced by the TSV 103, and thereby achieves a higher reliability of the silicon device 100 by preventing cracking of silicon, delamination of the TSV 103, and acceleration of electro-migration failure.

In other embodiments in which the substrate 105 includes an active interposer layer embedded with FETs 111, TSV induced stress may affect electron mobility of nearby FETs 111 and therefore impedes performance of the FETs 111. To prevent this adverse effect, a keep-out zone around the TSV 103 is maintained where FETs 111 cannot be placed. In some embodiments, the TSV 103 may include a reduction in the horizontal cross section of the TSV 103 at regions closest to FETs 111. For example, at the region near the FETs 111, the TSV 103 may have a decreasing profile, like any of the embodiments described herein. This provides the benefit of reducing the keep-out zone dimension/extent, and therefore reduces an amount of unutilized area of the active interposer layer (which may otherwise occur if there is no reduction in the horizontal cross section of the TSV 103).

In the above embodiments, the device 100 has been described as having one substrate 105. In other embodiments, the device 100 may include one or more additional substrates 105 that are stacked relative to each other. The device 100 may also include additional interconnect layer(s) between the substrates 105. In such cases, each of the substrates 105 may have a plurality of TSVs 103, with each TSV 103 having any of the embodiments of the profile described herein. The TSVs 103 at different substrates 105 allow electrical signal to be transmitted between the interconnect layers 107.

Although particular embodiments have been shown and described, it will be understood that they are not intended to limit the present inventions, and it will be obvious to those skilled in the art that various changes and modifications may be made without departing from the spirit and scope of the present inventions. The specification and drawings are, accordingly, to be regarded in an illustrative rather than restrictive sense. The present inventions are intended to cover alternatives, modifications, and equivalents, which may be included within the spirit and scope of the present inventions as defined by the claims. Claims listing steps do not imply any order of the steps.

What is claimed is:

1. A semiconductor device, comprising:
   a substrate having a top surface and a bottom surface; and
   a through-silicon via (TSV) extending from the top surface of the substrate to the bottom surface of the substrate, the TSV having a height and a side profile extending along a longitudinal axis;
   wherein the side profile has an upper segment forming a first angle relative to the longitudinal axis, and a lower segment forming a second angle relative to the longitudinal axis, the second angle being different from the first angle;
   wherein the lower segment has a height that is less than 20% of the height of the TSV; and
   wherein the second angle is greater than the first angle.

2. The semiconductor device of claim 1, wherein the first angle is about 0 degrees.

3. The semiconductor device of claim 2, wherein the lower segment has a tapered configuration.

4. The semiconductor device of claim 2, wherein the lower segment has a curvilinear configuration.

5. The semiconductor device of claim 1, wherein the upper segment has a first tapered configuration, the first angle being greater than 0 degrees.

6. The semiconductor device of claim 5, wherein the lower segment has a second tapered configuration, the second angle being greater than the first angle.

7. The semiconductor device of claim 5, wherein the lower segment has a curvilinear configuration.

8. The semiconductor device of claim 1, wherein the TSV has a rectangular horizontal cross section.

9. The semiconductor device of claim 1, wherein the TSV has a core and a layer surrounding the core.

10. The semiconductor device of claim 9, wherein the core comprises a conductive material, and the layer comprises an insulating material.

11. The semiconductor device of claim 1, wherein the TSV is coupled to one or more integrated circuits.

12. The semiconductor device of claim 1, further comprising an additional TSV having a same shape as that of the TSV, wherein the TSV is coupled to a first FPGA, and the additional TSV is coupled to a second FPGA.

13. The semiconductor device of claim 1, further comprising:
   an additional substrate that is stacked above the substrate; and
   an additional TSV having a same shape as that of the TSV.

14. A semiconductor device, comprising:
   a substrate having a top surface and a bottom surface; and
   a through-silicon via (TSV) extending from the top surface of the substrate to the bottom surface of the substrate, the TSV having a top portion, a middle portion, and a bottom portion;
   wherein at least one of the top portion and the bottom portion of the TSV has a cross-sectional dimension that is smaller than a cross-sectional dimension of the middle portion of the TSV;
   wherein the top portion of the TSV has the cross sectional dimension that is smaller than the cross sectional dimension of the middle portion of the TSV; and
   wherein the bottom portion of the TSV has the cross sectional dimension that is smaller than the cross sectional dimension of the middle portion of the TSV.

15. The semiconductor device of claim 14, wherein the cross sectional dimension of the top portion decreases as a first function of a distance away from the middle portion.

16. The semiconductor device of claim 14, wherein the cross sectional dimension of the bottom portion decreases as a second function of a distance away from the middle portion.

17. The semiconductor device of claim 14, wherein the substrate is an active layer.

18. A method of forming a through-silicon via (TSV) having a height and a side profile extending along a longitudinal axis, comprising:
   providing a substrate;
   anisotropically etching the substrate to form an upper segment of the side profile; and
   isotropically etching the substrate to form a lower segment of the side profile;
   wherein the upper segment forms a first angle relative to the longitudinal axis, the lower segment forms a second angle relative to the longitudinal axis, and the second angle is different from the first angle;
   wherein the lower segment has a height that is less than 20% of the height of the TSV; and
   wherein the second angle is greater than the first angle.

* * * * *